United States Patent [19]

Toda et al.

[11] Patent Number: 4,672,236
[45] Date of Patent: Jun. 9, 1987

[54] VOLTAGE-TO-FREQUENCY CONVERTER CIRCUIT

[75] Inventors: Masayoshi Toda; Seiichi Hamasaki, both of Fukuyama, Japan

[73] Assignee: Mitsubishi Denki Kabushiki Kaisha, Tokyo, Japan

[21] Appl. No.: 727,141

[22] Filed: Apr. 25, 1985

[51] Int. Cl.$^4$ .................. H03L 7/00; H03K 17/00
[52] U.S. Cl. .................. 307/271; 307/228; 328/150
[58] Field of Search ............ 307/271, 265, 519, 228; 328/150, 127, 148

[56] References Cited

U.S. PATENT DOCUMENTS

| | | | |
|---|---|---|---|
| 3,539,825 | 11/1970 | Hardaway | 307/271 |
| 3,560,864 | 2/1971 | Nihof | 307/271 |
| 3,835,419 | 9/1974 | Milne et al. | 307/271 |
| 4,031,532 | 6/1977 | First | 307/271 |
| 4,315,212 | 2/1982 | Gamoh | 324/142 |

Primary Examiner—Stanley D. Miller
Assistant Examiner—Timothy P. Callahan
Attorney, Agent, or Firm—Leydig, Voit & Mayer

[57] ABSTRACT

A voltage-to-frequency converter circuit comprising an input circuit which receives an input signal and converts it to a pair of D.C. voltage signals of equal absolute values and opposite polarities; a standard analog integrator cirucit which receives at its one input part the positive and negative D.C. voltage signals, alternately through an inverting switching circuit, so as to integrate them to a predetermined upper limit threshold value and lower limit threshold value; an output circuit which produces a rectangular wave signal that is inverted each time the output signal of the integrator reaches either of the upper limit threshold value or the lower limit threshold value; and a feed-forward circuit which creates voltage divider circuit between the D.C. voltage signal from the inverting switching circuit and the D.C. voltage signal of the output circuit. The voltage divider alters the value of the upper and lower limit threshold voltages, thereby maintaining a linear relation between the output frequency of the output circuit and the D.C. input voltage.

4 Claims, 4 Drawing Figures

VOLTAGE-TO-FREQUENCY CONVERTER CIRCUIT

BACKGROUND OF THE INVENTION

This invention relates to a voltage-to-frequency converter circuit which is chiefly used in an electronic wattmeter.

In an electronic wattmeter, the load voltage and consumption current of a distribution line are multiplied by means of a multiplier unit to create a voltage signal proportional to instantaneous power, the voltage signal is applied to a voltage-to-frequency converter circuit to provide, therefrom, a rectangular wave signal of a frequency proportional to the voltage signal or to the instantaneous power. The rectangular wave signals are counted by a counter circuit to calculate electric energy, and the electric energy is integrated and displayed by a display unit.

Here, in order to raise the precision of a wattmeter, the voltage-to-frequency converter circuit is required to have the linearity of the output frequency to the input voltage in the very wide voltage region of from several millivolts to several tens of volts.

With the voltage-to-frequency converter circuit of this type, however, a malfunction often occurs due to the operation delays of circuit elements in a high frequency region, so that the desired linearity is spoiled. This will be described in detail with reference to the prior-art voltage-to-frequency converter circuit shown in FIG. 1.

Referring to FIG. 1, numerals 10 and 10 designate a pair of input terminals. The input voltage signal being proportional to the instantaneous power from the multiplier unit as described above is received across the input terminals 10 and 10. By means of an input circuit 14, this signal is converted a pair of D.C. voltage signals. A positive voltage signal (ep) and (en) whose absolute values are equal and whose polarities are opposite. The input circuit 14 is comprised of an operational amplifier 11 and resistors 12, 13. Inverting switching circuit 15 is a traditional analog switch, resistor 16 connects input circuit 14, to a standard integrator circuit 17 comprising a capacitor 19 in the negative feedback circuit of an operational amplifier 18. An output circuit 20 is composed of an operational amplifier 21 and resistors 22, 23, to form a hysteresis comparator. More specifically, the output circuit 20 produces, as its output, a rectangular wave signal a ((B) in FIG. 2) which is inverted each time the output voltage $E_O$ of the integrator 17 reaches a predetermined upper limit threshold voltage value $+V_R$ or lower limit threshold voltage value $-V_R$ shown at (A) in FIG. 2. The rectangular wave signal a is also used as a signal for driving the inverting switching circuit 15.

Next, the operation of the above circuit arrangement will be explained. When the inverting switching circuit 15 is in the operating state illustrated in FIG. 1, the D.C. voltage signal ep is applied to the minus input portion 24 of the integrator 17, and the capacitor 19 is charged. Thus, integration is performed, and the output voltage $E_O$ of the integrator 17 lowers as indicated by a rightwardly-descending straight line $L_2$ in (A) of FIG. 2. When the output voltage $E_O$ has reached the predetermined lower limit value $-V_R$, the rectangular wave signal a provided from the hysteresis comparator 20 becomes logic level "0" as shown in (B) of FIG. 2. This rectangular wave signal a actuates the inverting switching circuit 15 which is then inverted, and the D.C. voltage signal en is applied to the minus input portion 24 of the integrator 17. Thus, charges in the capacitor 19 are discharged, and the output voltage $E_O$ of the integration circuit 17 rises as indicated by a rightwardly-ascending straight line $L_1$ in (A) of FIG. 2. When this output voltage $E_O$ has reached the predetermined upper limit value $+V_R$, the rectangular wave signal a from the hysteresis comparator 20 in FIG. 1 becomes logic level "1" as shown in (B) of FIG. 2. Then, the inverting switching circuit 15 is actuated and inverted again, back into the original state by this rectangular wave signal a.

The integral voltage $E_O$ in (A) of FIG. 2 thus obtained comes to have a steeper gradient as the input voltage signal e in FIG. 1 is greater, with the result that a period T indicated in (A) of FIG. 2 becomes shorter. Since this period T is identical to the period of the rectangular wave signal a in (B) of FIG. 2, theoretically the frequency of the rectangular wave signals a is proportional to the magnitude of the input voltage signal e.

In actuality, however, there are the so-called delays of circuit elements such as the delay between the input and output of the hysteresis comparator 20 in FIG. 1 and the change-over time of the inverting switching circuit 15, so that an overshoot voltage $E_r$ and an undershoot voltage $E_r$ shown in (A) of FIG. 2 appear. Thus, the period T of the integral voltage $E_O$ becomes longer than the true value $T_O$ by 4 $t_d$. Therefore, the foregoing proportional relationship between the input voltage signal e and the frequency of the rectangular wave signals a, i.e. the linearity, is spoiled. This will be explained below by the use of mathematical expressions:

Letting $R_3$ denote the resistance of the resistor 16 and C denote the capacitance of the capacitor 19, the quantity of charges which are stored by the overshoot is:

$$E_r C = (ep/R_3) \cdot t_d \quad \therefore E_r = (ep/C R_3) \cdot t_d \quad (1)$$

Accordingly, the quantity of charges in one period T becomes:

$$\frac{ep}{R_3} \cdot T = C \cdot (-4 V_R - 4 E_r)$$

$$= 4 C \left( -V_R - \frac{ep}{C R_3} \cdot t_d \right)$$

$$\therefore |T| = \left| \frac{R_3}{ep} \cdot 4 C \left( -V_R - \frac{ep}{C R_3} \cdot t_d \right) \right|$$

The frequency f becomes:

$$|f| = \left| \frac{1}{T} \right| = \left| \frac{ep}{4 C R_3 \left( -V_R - \frac{ep}{C R_3} \cdot t_d \right)} \right| \quad (2)$$

At $t_d = 0$, namely, in the absence of the overshoot, $f = (ep/4 \, C \, R_3)$ holds and it is proportional to the input voltage ep $(=e)$. At $t_d \neq 0$, however, the aforementioned proportional relationship does not hold.

SUMMARY OF THE INVENTION

This invention has been made in order to eliminate the disadvantage of the prior art described above, and has for its object to provide a voltage-to-frequency converter circuit which can ensure the linearity of an output frequency to an input voltage with a simple arrangement.

BRIEF DESCRIPTION OF THE DRAWINGS

In the drawings, the same symbols indicate identical or corresponding portions.

DESCRIPTION OF THE PREFERRED EMBODIMENT

Figure 1:
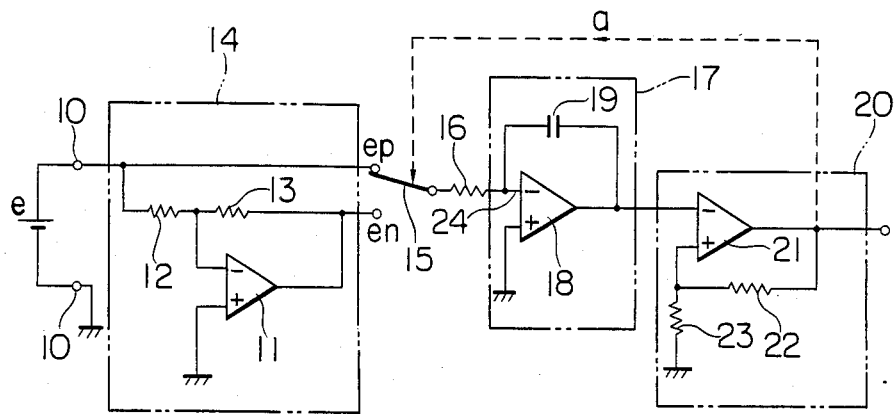
FIG. 1 is an electric circuit diagram showing a prior-art voltage-to-frequency converter circuit.
Figure 2:
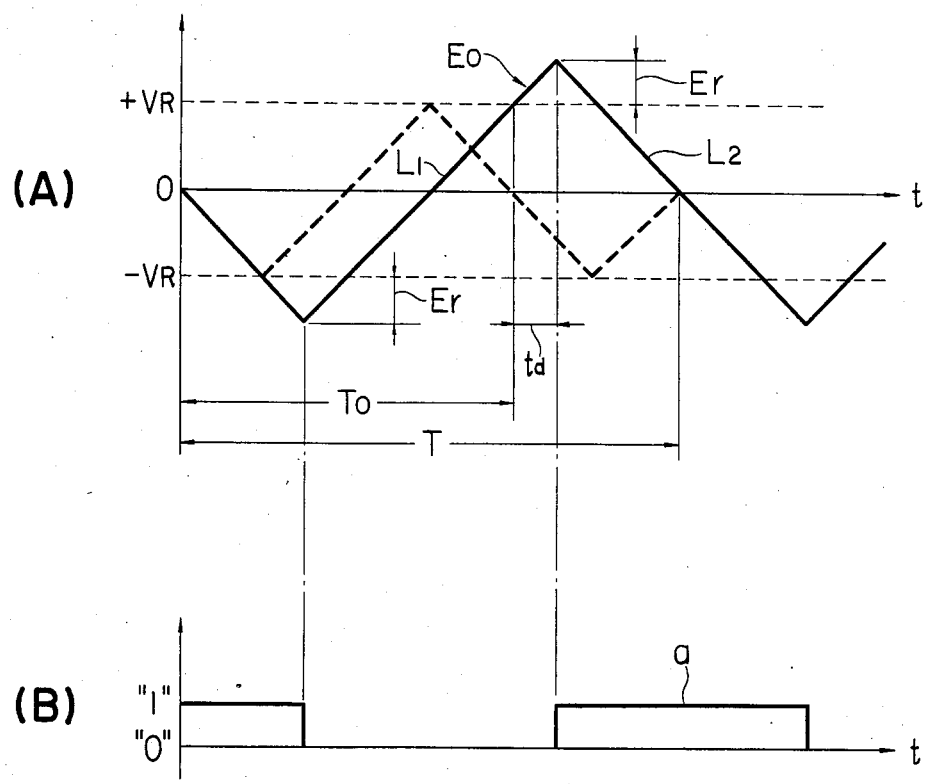
FIG. 2 is a signal waveform diagram for explaining the operation of the prior-art example.
Figure 3:
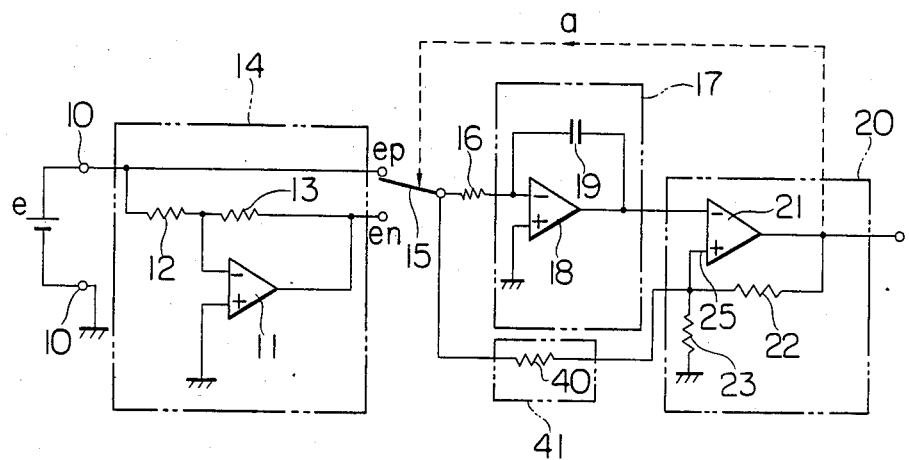
FIG. 3 is an electric circuit diagram showing an embodiment of a voltage-to-frequency converter circuit according to this invention.

FIG. 3 shows one example of a voltage-to-frequency converter circuit according to this invention. In the figure, an input circuit 14, an inverting switching circuit 15 and an integrator 17 are the same as in the arrangement of FIG. 1, and they shall be omitted from the description. The characterizing feature of this invention resides in a resistor 40 that is connected between the inverting switching circuit 15 and an output circuit 20 constructing a hysteresis comparator, to form a feed-forward circuit 41 which constitutes a voltage divider circuit along with resistors 22 and 23 in the output circuit 20.

More specifically, the feed-forward circuit 41 is made up of the resistor 40, and it is connected to the inverting switching circuit 15 and the plus input portion 25 of an operational amplifier 21, to receive the D.C. voltage signals en and ep, alternately, and the overshoot and undershoot signals +Er and −Er alternately, and to divide the voltages of the signals en, ep and ±E_r so that the linearity of the output frequency f to the input voltage signal e may be held. The feed-forward loop 41 thus brings the threshold voltage of the hysteresis comparator 21 to a level that overcomes the overshoot and undershoot voltages and, thus, maintains the desired linear relation between the input voltage and the output frequency. This will be explained below by the use of mathematical expressions.

Let R4 and R5 denote the resistances of the resistors 22 and 23, respectively, R6 denote the resistance of the resistor 40 of the feed-forward circuit 41, and Es denote output voltage signal of the hyteresis comparator. Voltage $V_t$ of the plus input portion 25 of the operational amplifier 21, which determines the threshold voltage of the output circuit 20, is as follows when the D.C. voltage signal ep is selected by the inverting switching circuit 15:

$$V_t = \frac{R_5 \| R_4}{R_6 + R_5 \| R_4} ep - \frac{R_6 \| R_5}{R_4 + R_6 \| R_5} E_s \tag{3}$$

Substituting $V_t$ of Eq. (3) into $-V_R$ of Eq. (2):

$$|f| = \left| \frac{1}{T} \right| \tag{4}$$

$$= \left| \frac{ep}{4\,C\,R_3 \left( \frac{-R_6//R_5}{R_4 + R_6//R_5} E_S + \frac{R_5//R_4}{R_6 + R_5//R_4} ep - \frac{ep}{C\,R_3} t_d \right)} \right|$$

Figure 4:
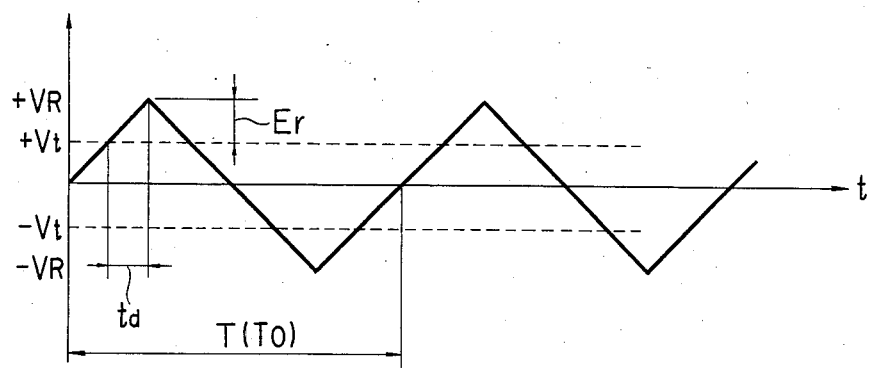
FIG. 4 is a signal waveform diagram for explaining the operation of the embodiment.

Here, by selecting R4, R5 and R6 so as to hold $$\frac{t_d}{C\,R_3} = \frac{R_5//R_4}{R_6 + R_5//R_4} \text{, the following holds:} \tag{5}$$

$$f = \frac{1}{T} = \frac{ep}{4\,C\,R_3 \left( \frac{R_6//R_5}{R_4 + R_6//R_5} E_s \right)}$$

and the output frequency f can be kept proportional to the input voltage ep (=e). That is, the relationship between the two can be endowed with the linearity. This is readily understood from the fact that the period T agrees with the true period $T_O$ as illustrated in FIG. 4.

When the voltage-to-frequency converter circuit whose linearity is good in this manner is applied to a wattmeter of the electronic type, the precision of the wattmeter is enhanced.

While, in the above embodiment, the two voltages of equal absolute values and opposite polarities are generated in the input circuit 14, it is needless to say that the input circuit 14 is dispensed with when the input voltage meets these conditions.

As set forth above, in this invention, a feed-forward circuit which is constructed of a resistor and which constitutes part of a voltage divider circuit is interposed between an inverting switching circuit and an output circuit. Thus, even in the presence of the operation delays of circuit elements, the linearity of an output frequency to an input voltage can be reliably held. Moreover, since the feed-forward circuit is constructed of the resistor, it does not incur the complication of the whole arrangement, and the power consumption can be reduced. Especially as an arrangement wherein the voltage of a D.C. voltage signal received through the inverting switching circuit is divided and then applied to an integrator, there is the advantage that the influence of the input offset voltage of an operational amplifier constituting the integrator is slight, so a voltage-to-frequency converter circuit of high precision is provided.

What is claimed is:

1. A voltage-to-frequency converter circuit comprising:
   an input means to receive a source signal and convert said source signal to a pair of D.C. voltage signals of equal absolute values and opposite polarities;
   an inverting switching circuit for alternately selecting one of the voltage signals of said pair of D.C. voltage signals;

an integrator responsive to the voltage signal selected by said inverting switching circuit for generating a first output signal;

output means responsive to said first output signal for producing a second output signal that is inverted each time said first output signal reaches a predetermined upper limit or lower threshold;

a feedback means receiving said second output signal from said output means and delivering it to said inverting switching circuit to cause said inverting switching circuit to alternately choose between one of said voltage signals in said pair of D.C. voltage signals only at the time said second output signal is inverted; and a feed-forward means comprising a voltage divider connected between said output means and said integrator for altering the voltage values of said upper and lower thresholds so as to maintain a linear relation between said D.C. input signal and the frequency of said second output signal.

2. A voltage-to-frequency converter circuit as claimed in claim 1 wherein said integrator comprises an operational amplifier and capacitor connected between an output and a negative input of said operational amplifier.

3. A voltage-to-frequency converter circuit as claimed in claim 2 wherein said output means comprises an operational amplifier such that a negative input of said operational amplifier receives said first output signal, a first resistor is connected between an output and a positive input of said operational amplifier, and a second resistor is connected between the positive input of said operational amplifier and a reference voltage.

4. A voltage-to-frequency converter circuit as claimed in claim 1 wherein said feed-forward means comprises a resistor included in said voltage divider.

* * * * *